(12) United States Patent  (10) Patent No.: US 9,537,486 B2
Yamaji et al.  (45) Date of Patent: Jan. 3, 2017

(54) SEMICONDUCTOR DEVICE AND POWER CONVERSION DEVICE USING THE SAME

(71) Applicant: FUJI ELECTRIC CO., LTD., Kawasaki-shi (JP)

(72) Inventors: Masaharu Yamaji, Matsumoto (JP); Hideaki Katakura, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 124 days.

(21) Appl. No.: 14/507,055

(22) Filed: Oct. 6, 2014

(65) Prior Publication Data

US 2015/0023082 A1    Jan. 22, 2015

Related U.S. Application Data

(63) Continuation of application No. PCT/JP2013/074916, filed on Sep. 13, 2013.

(30) Foreign Application Priority Data

Sep. 18, 2012  (JP) .................................. 2012-203809

(51) Int. Cl.
*H03K 19/0175* (2006.01)
*H01L 27/08* (2006.01)
(Continued)

(52) U.S. Cl.
CPC ..... *H03K 19/017509* (2013.01); *H01L 27/088* (2013.01); *H01L 27/0814* (2013.01);
(Continued)

(58) Field of Classification Search
CPC .............. H01L 27/088; H01L 29/8615; H01L 27/0814; H03K 19/017509; H02M 7/537
(Continued)

(56) References Cited

U.S. PATENT DOCUMENTS 5,045,900 A * 9/1991 Tamagawa ............ H01L 21/761
257/338
5,736,774 A   4/1998 Fujihira
(Continued)

FOREIGN PATENT DOCUMENTS

JP  06196630 A  7/1994
JP  09055498 A  2/1997
(Continued)

OTHER PUBLICATIONS

International Search Report issued in PCT/JP2013/074916 mailed Oct. 15, 2013. English translation provided.

*Primary Examiner* — Walter H Swanson
(74) *Attorney, Agent, or Firm* — Rossi, Kimms & McDowell LLP

(57) ABSTRACT

In a semiconductor device such as a three-phase one-chip gate driver IC, HVNMOSs configuring two set and reset level shift circuits are disposed on non-opposed surfaces, and it is thereby possible to reduce the amount of electrons flowing into drains of HVNMOSs of another phase due to a negative voltage surge. Also, distances from an opposed surface on the opposite side to the respective drains of the HVNMOSs configuring the two set and reset level shift circuits are made equal to or more than 150 μm, and it is thereby possible to prevent a malfunction of a high side driver circuit of another phase to which no negative surge is applied.

9 Claims, 11 Drawing Sheets

(51) Int. Cl.
 *H01L 29/861* (2006.01)
 *H02M 7/537* (2006.01)
 *H01L 27/088* (2006.01)
 *H02M 7/00* (2006.01)
 *H02M 7/5387* (2007.01)

(52) U.S. Cl.
 CPC ........ *H01L 29/8615* (2013.01); *H02M 7/537* (2013.01); *H02M 7/003* (2013.01); *H02M 7/5387* (2013.01)

(58) Field of Classification Search
 USPC .......................................... 363/131; 327/333
 See application file for complete search history.

(56) References Cited

U.S. PATENT DOCUMENTS

| | | | |
|---|---|---|---|
| 6,124,628 | A | 9/2000 | Fujihira et al. |
| 2005/0144539 | A1 | 6/2005 | Orita |
| 2009/0212373 | A1 | 8/2009 | Karino et al. |
| 2010/0283116 | A1 | 11/2010 | Shimizu |
| 2012/0267750 | A1 | 10/2012 | Imai et al. |

FOREIGN PATENT DOCUMENTS

| | | | |
|---|---|---|---|
| JP | 09074198 | A | 3/1997 |
| JP | 2005176174 | A | 6/2005 |
| JP | 2009206284 | A | 9/2009 |
| JP | 2010263116 | A | 11/2010 |
| JP | 2011238760 | A | 11/2011 |
| JP | 2011259531 | A | 12/2011 |
| JP | 2012227300 | A | 11/2012 |

\* cited by examiner

ELECTRONS 50 FLOWING INTO DRAIN 26

SEMICONDUCTOR DEVICE AND POWER CONVERSION DEVICE USING THE SAME

CROSS-REFERENCE TO RELATED APPLICATIONS

This application is a continuation of International Application No. PCT/JP2013/074916, filed on Sep. 13, 2013, which is based on and claims priority to Japanese Patent Application No. JP 2012-203809, filed on Sep. 18, 2012. The disclosure of the Japanese priority application and the PCT application in their entirety, including the drawings, claims, and the specification thereof, are incorporated herein by reference.

BACKGROUND

1. Field of the Invention

The present invention relates to a semiconductor device such as a high voltage IC having level shift circuits and a power conversion device such as an inverter using the semiconductor device.

2. Related Art

FIG. 8 is a circuit diagram of a three-phase motor Mo and a three-phase inverter which drives the three-phase motor Mo. The three-phase inverter is configured of a power module and a high voltage IC which controls the power module. The power module is configured of power semiconductor elements which are switching elements Q1 to Q6 and FWDs (Free Wheel Diodes) D1 to D6, and a three-phase full bridge circuit is formed of the power semiconductor elements. The high voltage IC is a three-phase one-chip gate driver ICs 500, 600 shown in FIG. 9.

The three-phase inverter is configured of three U-phase, V-phase, and W-phase half bridge circuits, and each half bridge circuit is configured of the upper-arm power semiconductor elements (Q1 to Q3 and D1 to D3) and lower-arm power semiconductor elements (Q4 to Q6 and D4 to D6). The connection points of the upper-arm power semiconductor elements (Q1 to Q3 and D1 to D3) and lower-arm power semiconductor elements (Q4 to Q6 and D4 to D6), forming midpoints Z between the half bridges, are connected to a VS terminal of a gate driver IC.

Also, the upper-arm power semiconductor elements (Q1 to Q3 and D1 to D3) are connected to a P terminal of the three-phase inverter, and the lower-arm power semiconductor elements (Q4 to Q6 and D4 to D6) are connected to an N terminal of the three-phase inverter. The midpoints Z of the individual phases are connected to the three-phase motor Mo which is an inductance load (L load). The power semiconductor elements are configured of, for example, IGBTs (Insulated Gate Bipolar Transistors), which are main switching elements, and reflux diodes. The P terminal and the N terminal are connected to a main power source Vcc of the three-phase inverter.

Parasitic inductances Lo exist on wires connected to the power semiconductor elements. When the power semiconductor elements configuring the three-phase inverter are switched, in particular, when the upper-arm power semiconductor element (for example, Q1) is turned off, a current I flows from the N terminal to the midpoint Z via D4, and a current I flows from the midpoint Z to the P terminal via D2. The parasitic inductances Lo exist in paths through which the currents I flow.

In particular, due to the effects of the current I flowing via D4 and the corresponding parasitic inductance Lo, the potential of the VS terminal of the three-phase one-chip gate driver IC 500, 600 connected to the power semiconductor element (Q1) oscillates transiently to a negative side with respect to the potential (a common potential (=a GND potential)) of the N terminal of the three-phase inverter. That is, a negative voltage surge lower than the potential of the N terminal is applied to the VS terminal.

FIG. 9 is a main portion layout diagram of the heretofore known three-phase one-chip gate driver ICs 500 and 600, wherein (a) of FIG. 9 is a diagram when U-phase, V-phase, and W-phase high side driver circuits 3, 4, and 5 are disposed in nonparallel, and (b) of FIG. 9 is a diagram when the U-phase, V-phase, and W-phase high side driver circuits 3, 4, and 5 are disposed in parallel.

In the three-phase one-chip gate driver ICs 500 and 600, for example, three n-well regions for forming the high side driver circuits 3, 4, and 5 are formed on a p semiconductor substrate. The n-well regions are formed by ion implanting and subsequently thermally diffusing group 5 impurities such as phosphorus. HVNMOSs (High-voltage n-channel metal-oxide semiconductors: High voltage NMOSs) 28 disposed on the V-phase in (a) of FIG. 9 are disposed on an opposed surface 10 opposite to the W-phase to which the V-phase is connected via an interphase region, and the HVNMOSs 28 disposed on the W-phase in (b) of FIG. 9 are disposed on an opposed surface 10b opposite to the V-phase to which the W-phase is electrically connected via the interphase region. In the three-phase one-chip gate driver IC 500, distances M between n-drain regions 26 of the HVNMOSs 28 configuring set and reset level shift circuits 6a and 7a of the V-phase and the opposed surface 10b of the W-phase are equal to each other. Also, in the three-phase one-chip gate driver IC 600, distances M between the n-drain regions 26 of the HVNMOSs 28 configuring set and reset level shift circuits 6b and 7b of the W-phase and the opposed surface 10 of the V-phase are equal to each other.

FIG. 10 is a configuration diagram of the three-phase one-chip gate driver IC 600 of (b) of FIG. 9, wherein (a) of FIG. 10 is a main portion sectional view taken along the line D-D' of (b) of FIG. 9, and (b) of FIG. 10 is an enlarged plan view of the vicinity of the n-drain region 26 of (a) of FIG. 9. FIG. 10 shows a flow of electrons 50.

The V-shape high side driver circuit 4 includes an n-well region 29 formed on the front surface layer of the p semiconductor substrate 21, a p-well region 30, formed on the front surface layer of the n-well region 29, to which the VS terminal is connected, an n region 31 to which a VB terminal is connected, and an n-well region 22a forming a high voltage junction termination region 46 (HVJT).

In an interphase region 70, a p-well region 60 formed on the front surface of the p semiconductor substrate 21 is connected to a COM terminal 42 of a ground potential via p-base regions 23, 36, and 37.

The HVNMOS 28 of the W-phase includes an n-well region 22b forming a drift region and an n-source region 24 formed on the p-base region 23. The HVNMOS 28 of the W-phase further includes a gate terminal 43 formed, via a gate insulating film, on the p-base region 23 sandwiched between the n-source region 24 and the n-well region 22b, the n-drain region 26 formed on the n-well region 22b, and a drain terminal 44 connected to the n-drain region 26.

In FIG. 10, when a negative voltage surge is input into the VS terminal 40 of the V-phase, and the n-well region 29 in which the V-phase high side driver circuit 4 is formed undershoots to a negative voltage, electrons 50 are injected into the p-well region 60 from the n-well region 22a (opposed surface 10). The injected electrons 50 flow into the n-drain region 26 of the HVNMOS 28 configuring the level shift circuit 6b of the W-phase. The electrons 50 flows to the W-phase high side driver circuit 5 via a level shift resistor 45b connected to the drain terminal 44. A voltage drop occurs by the electrons 50 flowing into the level shift resistor 45b. Because of this, as the voltage drop becomes higher when the amount of electrons 50 flowing into the n-drain region 26 increases, it causes a malfunction of the W-phase high side driver circuit 5.

pn junction surfaces wherein the n-well region 22a, in which the high voltage junction termination region 46 of the V-phase high side driver circuit 4 is formed, and the n-well region 22b, in which the high voltage junction terminal region of the W-phase high side driver circuit 5 is formed, are opposite to each other via the interphase region are called the opposed surfaces 10 (V-phase side) and 10b (W-phase side), and pn junction surfaces which are not opposite to each other are called non-opposed surfaces 11b (V-phase side) and 12b (W-phase side).

Japanese Patent Application Publication No. JP-A-2010-263116 (also referred to herein as "PTL 1") describes a method of preventing a drop to a negative voltage by inserting a diode between a VS terminal and GND terminal which drop to a negative voltage in order to prevent a high side driver circuit from malfunctioning due to a negative voltage surge input into a high voltage IC.

Also, Japanese Patent Application Publication No. JP-A-2005-176174 (also referred to herein as "PTL 2") describes a method of providing a dummy level shift circuit connected to a malfunction detection circuit in parallel with a level shift circuit. Both of the methods, being such that a malfunction prevention function is provided targeted at a single-phase (half bridge) gate driver IC, are measures taken for the gate driver IC's own phase, but neither of the methods are measures taken for another phase.

As measures to prevent a malfunction of a high side driver circuit when a negative voltage surge is input, a further description will be given of the details of the previously described PTL 1 and PTL 2. It is described in PTL 1 that in a half bridge, a high voltage diode is provided inside the high voltage IC between a common ground node COM (the GND terminal) and a virtual ground node VS (the VS terminal) utilizing a common substrate region. When the virtual ground potential node VS is at a negative potential, the clamping high voltage diode attains a forward bias state. A current is supplied to the virtual ground potential node VS, and the voltage level of the virtual ground potential node VS can be clamped to a voltage level GND-Vf which is lower than the ground voltage of the common ground node COM by its own forward drop voltage (Vf), meaning that it is possible to absorb a negative voltage surge and reduce the undershoot of the virtual ground potential VS.

It is described in PTL 2 that in the half bridge of an L load, an erroneous signal detection circuit is connected in parallel to the level shift circuit, and that the erroneous signal detection circuit is such that the HVNMOS configuring the level shift circuit, being a dummy switching element fixed to off in a normal usage condition, includes two on (set) and off (reset) level shift circuits, and the two level shift circuits have the same configuration. The erroneous signal detection circuit outputs a voltage drop of an erroneous signal detection resistor as an erroneous signal generation signal SD indicating the generation of an erroneous signal in the level shift circuit, the erroneous signal generation signal SD is input into the malfunction prevention circuit via a NOT gate, and the malfunction prevention circuit, in response to the erroneous signal generation signal SD, carries out a predetermined process for preventing the malfunction.

Also, it is not clearly described in Japanese Patent Application Publication No. JP-A-9-55498 whether in a three-phase one-chip gate driver IC, an HVNMOS configuring a level increasing level shift circuit is disposed on an opposed surface of another phase or is disposed on a non-opposed surface (herein, a surface perpendicular to the opposed surface).

In both the heretofore known three-phase one-chip driver ICs 500 and 600 shown in FIGS. 9 and 10, the HVNMOSs 28 configuring the set and reset level shift circuits 6b and 7b are formed on the opposed surface 10b. With this kind of configuration, for example, when a negative voltage surge is applied to the V-phase, a large amount of electrons 50 flows into the n-drain region 26 of the HVNMOS 28 of the W-phase, and a malfunction occurs in the W-phase high side driver circuit.

In the previously described PTLs 1 and 2, it is necessary to form a high voltage diode or a malfunction detection HVNMOS inside the high voltage IC, thus leading to an increase in chip area. For example, as a high voltage junction termination region width (the width of the HVJT) in a 600V-class high voltage IC is on the order of 100 μm, the chip size of a three-phase one-chip gate driver IC is on the order of three times as large as a half bridge one-chip driver IC, thus leading to a significant increase in chip area.

Also, the heretofore known measures to prevent the malfunction due to a negative voltage surge, as they are for the half bridge gate driver IC and are a malfunction suppression or detection function for the half bridge gate driver IC's own phase, are not effective for a malfunction of the high side driver circuit, due to an flow of electrons into another phase which occurs, in the case of the three-phase one-chip gate driver IC, or the like.

SUMMARY OF THE INVENTION

The invention has for its object to solve the heretofore described problems and provide a semiconductor device including two set and reset level shift circuits wherein it is possible to prevent a malfunction of a high side driver circuit of another phase when a negative voltage surge is applied, and a power conversion device using the semiconductor device.

In order to solve the heretofore described problems and achieve the object, a semiconductor device according to the invention has the following characteristics. The semiconductor device includes a plurality of second conductivity type first well regions, each surrounded by a first conductivity type region, which are provided spaced from one another on the front surface layer of a semiconductor substrate; and a first conductivity type second well region, provided in contact with all the plurality of first well regions, which configures the first conductivity type region and to which a low potential is applied. The plurality of first well regions each include a high side driver circuit, provided on the front surface layer of the first well region, a potential on the low potential side of which is higher than the low potential; a second conductivity type pickup region, provided on the front surface layer of the first well region, to which is connected the high potential side of a power source of the high side driver circuit; a high voltage junction termination structure provided in the first well region between the second well region and the pickup region; and two level shift elements, each provided in one portion of the high voltage junction termination structure and second well region, which send signals for driving the high side driver circuit. The semiconductor device is characterized in that the two level shift elements are disposed on respective non-opposed surfaces which are not opposite to the adjacent first well region, and distances to high potential regions of the two level shift elements from a pn junction surface, of a pn junction surface of the first well region and second well region, which is opposite to the adjacent first well region are equal to or more than 150 μm.

In order to solve the heretofore described problems and achieve the object, a semiconductor device according to the invention has the following characteristics. The semiconductor device includes a plurality of second conductivity type first well regions, each surrounded by a first conductivity type region, which are provided spaced from one another on the front surface layer of a semiconductor substrate; and a first conductivity type second well region, provided in contact with all the plurality of first well regions, which configures the first conductivity type region and to which a low potential is applied. The plurality of first well regions each include: a high side driver circuit, provided on the front surface layer of the first well region, a potential on the low potential side of which is higher than the low potential; a second conductivity type pickup region, provided on the front surface layer of the first well region, to which is connected the high potential side of a power source of the high side driver circuit; a high voltage junction termination structure provided in the first well region between the second well region and the pickup region; and two level shift elements, each provided in one portion of the high voltage junction termination structure and second well region, which send signals for driving the high side driver circuit. The semiconductor device is characterized in that the two level shift elements are disposed on respective non-opposed surfaces which are not opposite to the adjacent first well region, and the difference between distances to high potential regions of the two level shift elements from the adjacent first well region is equal to or less than 10 μm.

Also, the semiconductor device according to the invention is characterized in that in the heretofore described aspect of the invention, the distance from the pn junction surface, of the pn junction surface of the first well region and second well region, which is opposite to the adjacent first well region is shorter to the pickup region than to each of the high potential regions of the two level shift elements.

Also, the semiconductor device according to the invention is characterized in that in the heretofore described aspect of the invention, the distances from the adjacent first well region to the high potential regions of the two level shift elements are substantially equal.

Also, the semiconductor device according to the invention is characterized in that in the heretofore described aspect of the invention, the distances to the high potential regions of the two level shift elements from the pn junction surface, of the pn junction surface of the first well region and second well region, which is opposite to the adjacent first well region are equal to or more than 150 μm.

Also, the semiconductor device according to the invention is characterized in that in the heretofore described aspect of the invention, the distances to the high potential regions of the two level shift elements from the pn junction surface, of the pn junction surface of the first well region and second well region, which is opposite to the adjacent first well region are equal to or less than 500 μm.

Also, a power conversion device according to the invention is characterized in that the heretofore described semiconductor device is mounted on the power conversion device.

According to the semiconductor device according to the invention, it is possible to reduce the amount of electrons flowing into a high potential region of a level shift element of another phase due to a negative voltage surge. Consequently, it is possible to suppress a malfunction of a high side driver circuit including at least two level shift elements.

As a result of this, it is possible to improve the negative voltage surge withstand of a high voltage IC.

BRIEF DESCRIPTION OF DRAWINGS

FIGS. 1A and 1B are configuration diagrams of a semiconductor device 100 according to a working example 1 of the invention, wherein FIG. 1A is a main portion plan view, and FIG. 1B is a detail plan view of the vicinity of a drain of FIG. 1 A;

FIGS. 2A-2C are sectional views of each portion, wherein FIG. 2A is a main portion sectional view taken along the line A-A' (dashed line) of FIG. 1A, FIG. 2B is a main portion sectional view taken along the line B-B' (solid line) of FIG. 1A, and FIG. 2C is a main portion sectional view taken along the line C-C' (dashed-dotted line) of FIG. 1A;

FIGS. 3A and 3B are diagrams showing a flow of electrons 50 into a U-phase when a negative voltage surge is applied to a VS terminal 40 of a V-phase, wherein FIG. 3A is a diagram showing electrons 50 flowing through a portion taken along the line B-B' of FIG. 1A, and FIG. 3B is a diagram showing electrons 50 flowing through a portion taken along the line C-C' of FIG. 1A;

FIGS. 9A and 9B are main portion layout diagrams of heretofore known three-phase one-chip gate driver ICs 500 and 600, wherein FIG. 9A is a diagram when U-phase, V-phase, and W-phase high side driver circuits 3, 4, and 5 are disposed in nonparallel, and FIG. 9B is a diagram when the U-phase, V-phase, and W-phase high side driver circuits 3, 4, and 5 are disposed in parallel;

FIGS. 10A and 10B are configuration diagrams of the three-phase one-chip gate driver IC 600 of FIG. 9B, wherein FIG. 10A is a main portion sectional view taken along the line D-D' of FIG. 9B, and FIG. 10B is an enlarged plan view of the vicinity of an n-drain region 26 of FIG. 10A;

DETAILED DESCRIPTION

The invention relates to a three-phase one-chip gate driver IC which prevents a malfunction of an adjacent (for example, V-phase or W-phase) high side driver circuit (seen from a U-phase) due to a flow of electrons into the high side driver circuit when a negative voltage surge is generated. Next, an embodiment will be described using the following working examples.

WORKING EXAMPLE 1

Figure 1A:
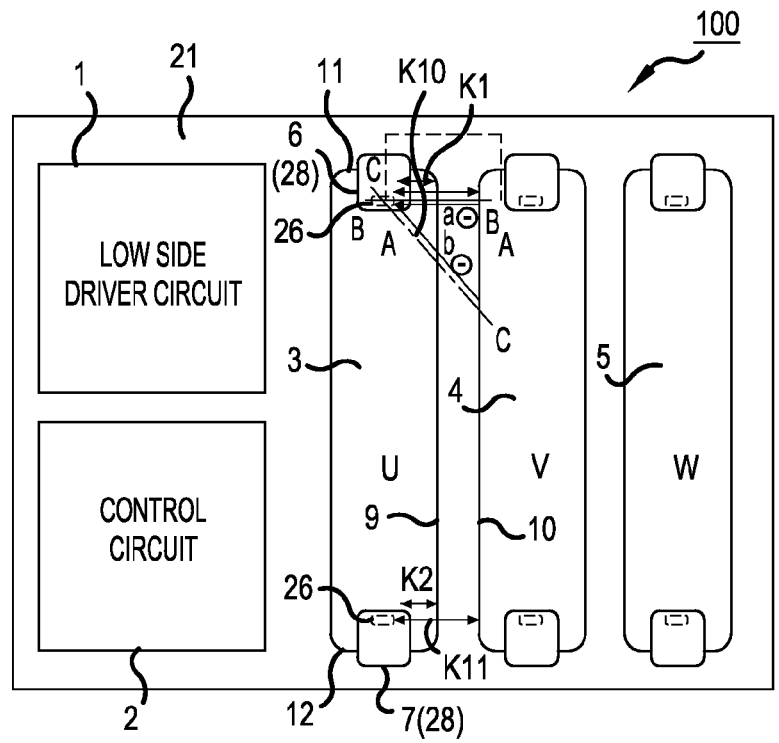
Figure 1B:
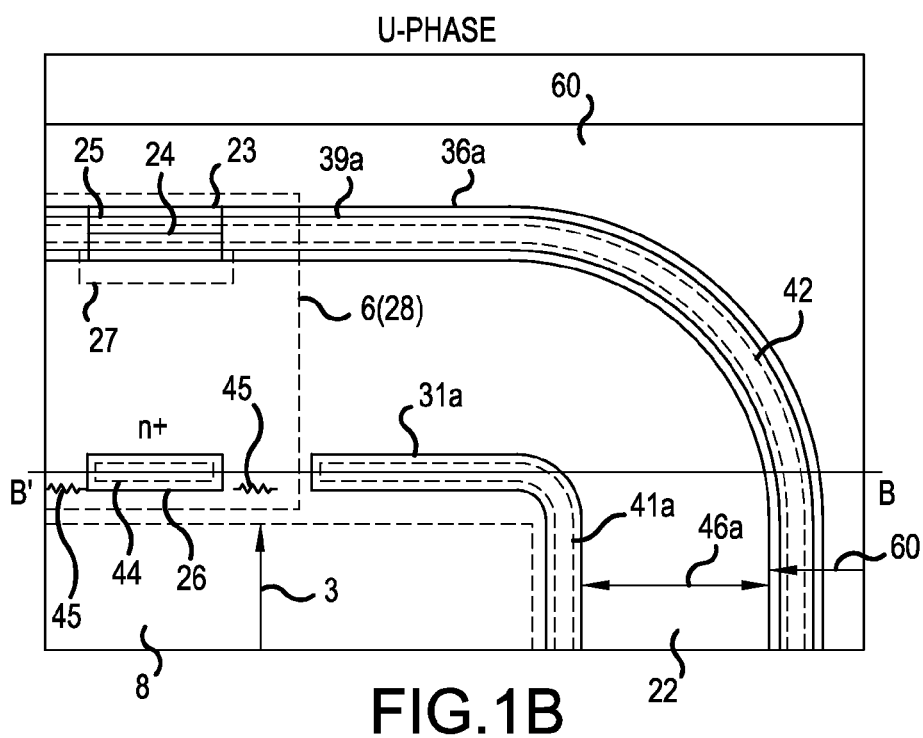
Figure 2A:
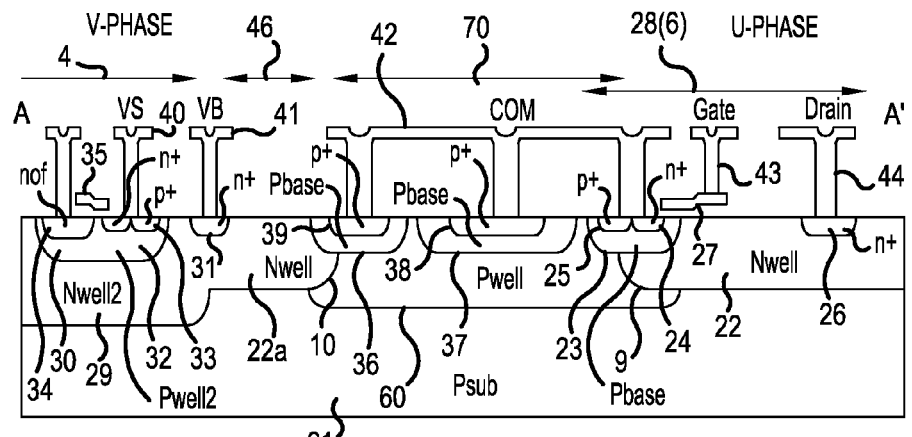
Figure 2B:
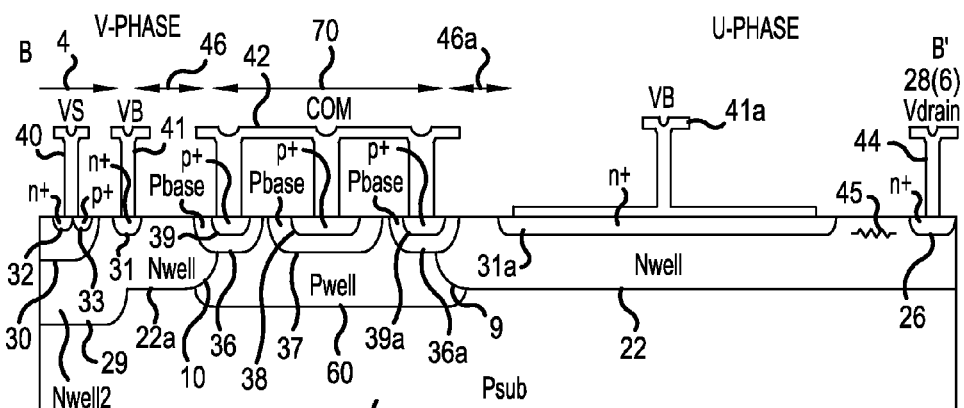
Figure 2C:
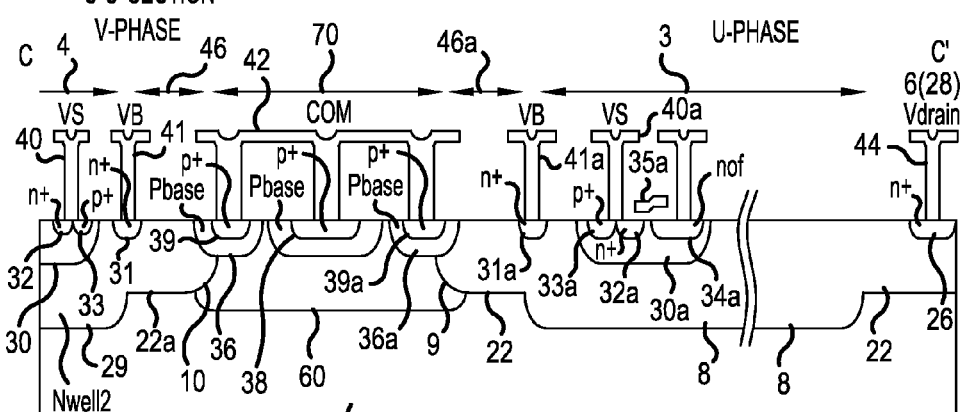

FIGS. 1A and 1B and 2A-2C are configuration diagrams of a semiconductor device 100 according to a working example 1 of the invention, wherein FIG. 1A is a main portion plan view, and FIG. 1B is a detail plan view of the vicinity of a drain in FIG. 1A, while FIG. 2A is a main portion sectional view taken along the line A-A' (dashed line) of FIG. 1A, FIG. 2B is a main portion sectional view taken along the line B-B' (solid line) of FIG. 1A, and FIG. 2C is a main portion sectional view taken along the line C-C' (dashed-dotted line) of FIG. 1A. In FIG. 1, a U-phase is depicted on the left side of a V-phase, but in FIG. 2, the U-phase is depicted on the right side of the V-phase.

The semiconductor device 100 is a high voltage IC having level shift circuits, and is, for example, a three-phase one-chip gate driver IC on which are mounted driver circuits which drive a three-phase inverter. In FIG. 1A, the semiconductor device 100 includes a low side driver circuit 1, a control circuit 2, a U-phase high side driver circuit 3, a V-phase high side driver circuit 4, and a W-phase high side driver circuit 5. The semiconductor device 100 includes high voltage junction termination structures (46 and the like) surrounding the high side driver circuits 3, 4, and 5, set level shift circuits (6 and the like), each disposed in one portion of each of n-well regions (22, 22a, and the like) in which the high voltage junction termination structure are formed, reset level shift circuits (7 and the like), and an interphase region 70 formed between one high side driver circuit and another high side driver circuit. The n-well regions (22, 22a, and the like) are formed so as to surround respective n-well regions (8, 29, and the like), and the external shape in plan view of the n-well regions (22, 22a, and the like) is a substantially polygonal shape formed of a plurality of straight line portions and corner portions.

To give a description taking the U-phase as an example, the set and reset level shift circuits 6 and 7 each include a level shift element which is turned on and off in response to signals from the control circuit 2 and a level shift resistor connected to the high potential side of the level shift element. Each of the level shift circuits 6 and 7 connects the connection point of the level shift element and level shift resistor and the high side driver circuit. The level shift circuits 6 and 7 are not disposed on an opposed surface 9 opposite to the n-well region 22 of another phase (for example, the V-phase) to which the U-phase is connected via the interphase region, but are disposed on surfaces (non-opposed surfaces 11 and 12) perpendicular to the opposed surface 9 so as to face each other.

Furthermore, respective n-drain regions 26 of HVNMOSs 28 configuring the set and reset level shift circuits 6 and 7 are desirably such that the distances to the opposed surface 9 of the U-phase from an opposed surface 10 (the opposed surface on the opposite side (or of the V-phase)) of another phase opposite to the opposed surface 9 of the U-phase is made uniform, that is, a distance K10 to the opposed surface 10 from the n-drain region 26 of the level shift circuit 6 and a distance K11 to the opposed surface 10 from the n-drain region 26 of the level shift circuit 7, are made equal.

However, a slight difference may occur between the distances due to process variations. Also, it is preferable to make the difference between the distance K10 and the distance K11 equal to or less than 10 µm without making the distances K10 and K11 equal. In the event that the difference between the distance K10 and the distance K11 is equal to or less than 10 µm, it is possible to suppress a malfunction of the high side driver circuit 3 due to the difference between the amounts of electrons 50 flowing into the n-drain regions 26. The suppression of the malfunction of the high side driver circuit 3 due to the difference between the amounts of the electrons 50 flowing into the n-drain regions 26 also applies equally to the difference between distances K1 and K2 from the opposed surface 9 (the opposed surface on the U-phase side) to the n-drain regions 26 of the U-phase. The opposed surface 9 and the non-opposed surface 11 are of a pn junction surface of the n-well region 22 and a p-well region 60. In the following description, the same signs are used in the U-phase, V-phase, and W-phase for the HVNMOSs and portions configuring the HVNMOSs.

In FIG. 1B, the n-well region 22 between the n-drain region 26 and an n region 31a which is a pickup region connected to a VB terminal 41a forms a level shift resistor 45. The VB terminal 41a is connected to a power source which drives the high side driver circuits (the power source outputs a voltage wherein a predetermined voltage (for example, 15V) is added to a VS potential), and the voltage of the power source which drives the high side driver circuits is applied to the n region 31a which is the pickup region.

In FIGS. 2A-2C, the HVNMOS 28 of the level shift circuit 6 of the U-phase of the semiconductor device 100 includes a plurality of the n-well regions 22 disposed on the front surface layer of a p semiconductor substrate 21 and a p-base region 23 disposed so as to be bridged between the n-well region 22 and the p-well region 60 of the interphase 70 disposed on the front surface layer of the p semiconductor substrate 21 so as to be adjacent to the n-well region 22. As shown in FIG. 1B, the p-base region 23 is connected to a p-base region 36a.

The HVNMOS 28 includes an n-source region 24 and a p-contact region 25, disposed on the front surface layer of the p-base region 23, and the n-drain region 26 disposed on the front surface layer of the n-well region 22 so as to be spaced from the p-base region 23. As shown in FIG. 1B, the p-contact region 25 is connected to a p region 39a. The HVNMOS 28 includes a gate electrode 27 disposed, on the p-base region 23 sandwiched between the n-source region 24 and the n-well region 22, via an unshown gate insulating film, the n region 31a which is the pickup region disposed on the front surface layer of the n-well region 22 so as to be spaced from the n-drain region 26, and the VB terminal 41a connected to the n region 31a.

Also, the n-drain region 26 is the high potential region of the HVNMOS 28, and the n-source region 24 is the low potential region of the HVNMOS 28. The n region 31a which is the pickup region is disposed in a position closer in distance to the opposed surface 9 than the n-drain region 26. Also, the HVNMOS 28 includes a gate terminal 43 connected to the gate electrode 27 and a drain terminal 44 connected to the n-drain region 26. In the U-phase high side driver circuit 3, the n-well region 22 between the n-drain region 26 and the n region 31a is the level shift resistor 45.

The V-phase high side driver circuit 4 includes another (left side) n-well region 22a (that is, the adjacent n-well region seen from the U-phase high side driver circuit 3) disposed on the front surface layer of the p semiconductor substrate 21 so as to be spaced from the n-well region 22 via the p-well region 60, the n-well region 29 in contact with the n-well region 22a, a p-well region 30 disposed on the front surface layer of the n-well region 29, and an n region 31 disposed on a front surface layer bridged between the n-well region 22a and the n-well region 29 so as to be spaced from the p-well region 30. The V-phase high side driver circuit 4 includes an n region 32 and p region 33 disposed on the front surface layer of the p-well region 30, an n region 34 disposed spaced from the n region 32, and a gate electrode 35 disposed on the p-well region 30 via an unshown gate insulating film in a region sandwiched between the n region 32 and the n region 34. Also, the high side driver circuit 4 includes a VS terminal 40 connected to the n region 32 and p region 33 and a VB terminal 41 connected to the n region 31.

The interphase region 70 includes, on the p semiconductor substrate 21, the p-well region 60 disposed between the n-well region 22 of the U-phase and the n-well region 22a of the V-phase, a p-base region 36 disposed so as to be bridged between the p-well region 60 and the n-well region 22a, and a p-base region 37 disposed, spaced from the two p-base regions 23 and 36, on the front surface layer of the p-well region 60 sandwiched between the two p-base regions 23 and 36. The interphase region 70 includes a p region 38 disposed on the front surface layer of the p-base region 37, a p region 39 disposed on the front surface layer of the p-base region 36, and a COM terminal 42 connected to the p region 39, p region 38, p-contact region 25, and n-source region 24. Also, the two p-base regions 36 and 37 may be omitted.

In the U-phase high side driver circuit 3, the n-well region 22 between the n region 31a and the p-base region 36a is a high voltage junction termination region 46a in which the high voltage junction termination structure is mainly formed. In the V-phase high side driver circuit 4, the n-well region 22a between the n region 31 and the p-base region 36 is a high voltage junction termination region 46, 46a in which the high voltage junction termination structure is mainly formed. The high voltage junction termination region 46 in which the high voltage junction termination structure is formed is a region in which to secure the breakdown voltage between the low side driver circuit 1 and control circuit 2 and the high side driver circuits 3, 4, and 5 of the individual phases (U-phase, V-phase, and W-phase), and also, a region in which to secure the breakdown voltage between the high side driver circuits 3, 4, and 5 of the individual phases.

Also, the signs 30a, 31a, 32a, 33a, 34a, 35a, 36a, 40a, 41a, and 46a in the U-phase correspond to the signs 30, 31, 32, 33, 34, 35, 36, 40, 41, and 46 in the V-phase.

Figure 3A:
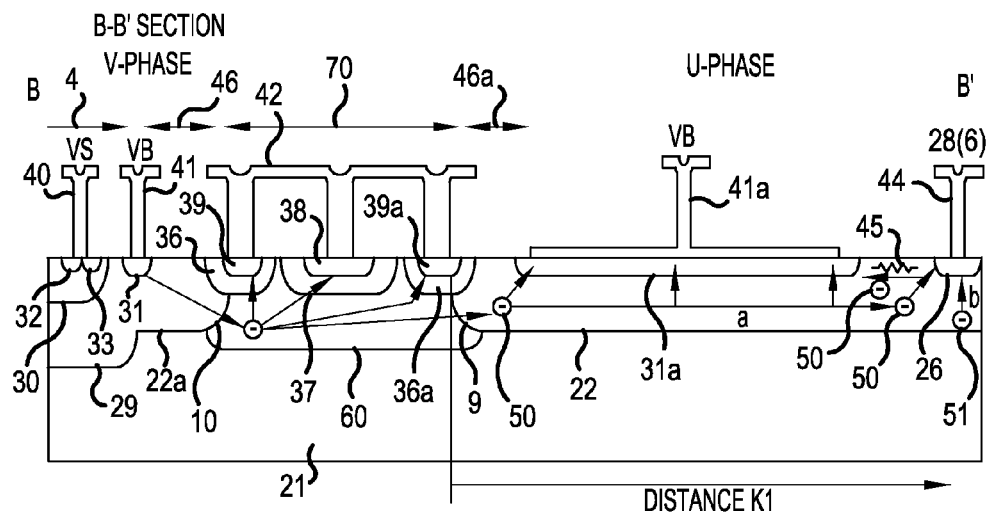
Figure 3B:
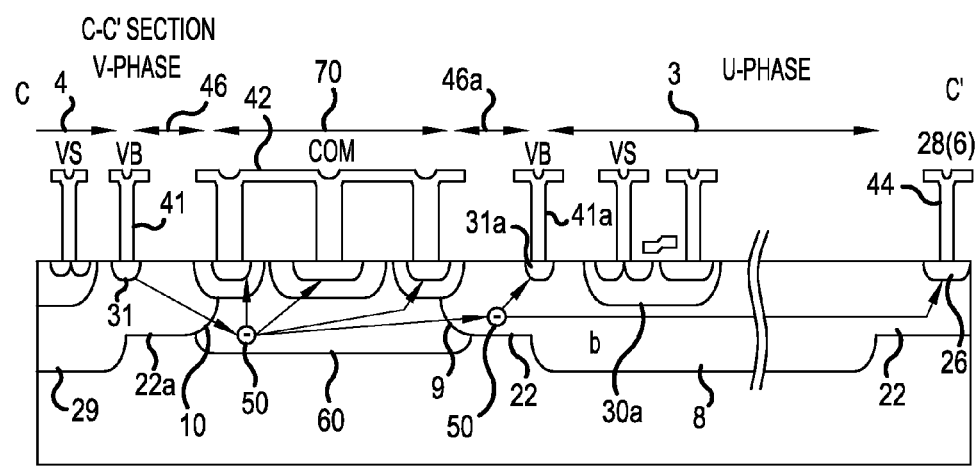

FIGS. 3A and 3B are diagrams showing a flow of electrons 50 into the U-phase when a negative voltage surge is applied to the VS terminal 40 of the V-phase, wherein FIG. 3A is a diagram showing electrons 50 flowing through a portion taken along the line B-B' of FIG. 1A, and FIG. 3B is a diagram showing electrons 50 flowing though a portion taken along the line C-C' of FIG. 1A.

In FIG. 3A, when a negative voltage surge is applied to the VS terminal 40 of the V-phase, electrons 50 are injected into the p-well region 60 from the n-well region 22a of the V-phase via a PN junction surface (the opposed surface 10) between the n-well region 22a of the V-phase and the interphase region 70. The electrons 50 injected into the p-well region 60 flow into the n-well region 22 of the U-phase via the opposed surface 9 which is the PN junction surface. The electrons 50 having flowed into the n-well region 22 of the U-phase flow into the VB terminal 41a via the n-region 31a.

Meanwhile, in FIG. 3B, electrons 50 are injected into the p-well region 60 from the n-well region 22a of the V-phase via the PN junction surface (opposed surface 10) between the n-well region 22a of the V-phase and the interphase region 70. The electrons 50 injected into the p-well region 60 flow into the n-well region 22 of the U-phase via the opposed surface 9 which is the PN junction surface. The electrons 50 having flowed into the n-well region 22 of the U-phase flow into the VB terminal 41a via the n region 31a. One portion of the electrons 50 having flowed into the n-well region 22 of the U-phase flows into the n-drain region 26. The electrons 50 having flowed into the n-drain region 26 flow into the VB terminal 41a via the level shift resistor 45. As the path into which electrons 50 flow is long, and series resistance (the lateral resistance of the n-well regions 22 and 8) increases in proportion to the length of the path of electrons 50, the amount of electrons 50 flowing into the n-drain region 26 decreases. The electrons 50 having flowed into the n-drain region 26 of the HVNMOS 28 flow to the U-phase high side driver circuit 3. As the amount of electrons 50 flowing into the n-drain region 26 is small, a voltage drop occurring in the level shift resistor 45 is also low. Consequently, it is difficult for a malfunction of the high side driver circuit 3 to occur.

Also, as heretofore described, the HVNMOSs 28 of the U-phase are disposed on the non-opposed surfaces 11 and 12 different from the opposed surface 9, and the difference between the distance K10 from the opposed surface 10 to the n-drain region 26 of the set HVNMOS 28 and the distance K11 from the opposed surface 10 to the n-drain region 26 of the reset HVNMOS 28 is equal to or less than 10 μm. Because of this, the difference between the amounts of electrons 50 flowing into the respective n-drain regions 26 of the HVNMOSs 28 decreases. Consequently, it is possible to prevent a malfunction of the high side driver circuit 3 from occurring when there is a large difference between the amounts of electrons 50 flowing into the respective n-drain regions 26 of the HVNMOSs 28. More preferably, there is no difference between the distance K10 and the distance K11, that is, it is preferable that the distance K10 and the distance K11 are substantially equal. By so doing, the amounts of electrons 50 flowing into the respective n-drain regions 26 of the HVNMOSs 28 can be made substantially equal. Heretofore, a description has been given taking for example the U-phase high side driver circuit 3, but the invention, not being limited to the U-phase high side driver circuit 3, can also be applied to the V-phase high side driver circuit 4 and W-phase high side driver circuit 5.

Figure 4:
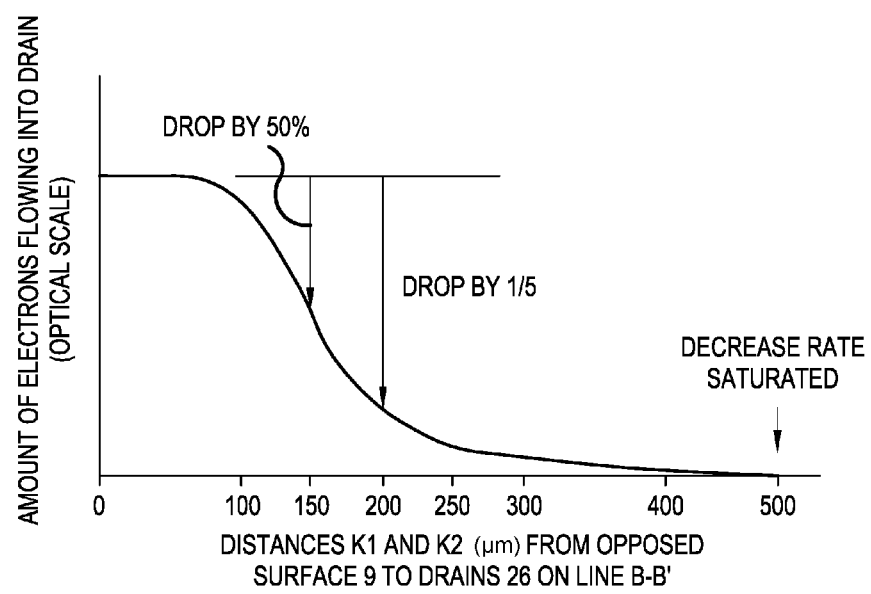
FIG. 4 is a diagram showing a relationship between the amount of electrons 50, which flow into n-well regions 22 and 8 of the U-phase from an opposed surface 9 of the U-phase, flowing into an n-drain region 26 and a distance K1 and distance K2 to the n-drain regions 26 from the opposed surface 9.

FIG. 4 is a diagram showing a relationship between the amount of electrons 50, which have flowed into the n-well regions 22 and 8 of the U-phase from the opposed surface 9 of the U-phase, flowing into the n-drain region 26 and the distance K1 and distance K2 to the n-drain regions 26 from the opposed surface 9.

As shown in FIG. 4, when the distance K1 and the distance K2 increase, the amount of electrons 50 flowing in decreases rapidly. In particular, when the distance K1 and the distance K2 are between 100 μm and 200 μm, the amount of electrons 50 flowing in decreases steeply. Specifically, the amount of electrons 50 flowing into the n-drain region decreases by approximately 50% when the distance K1 and the distance K2 are 150 µm, and the amount of electrons 50 flowing in decreases by approximately ⅕ when the distance K1 and the distance K2 are 200 µm. The amount of electrons flowing in continues a substantially steady decrease when the distance K1 and the distance K2 exceed 200 µm, but becomes substantially zero when the distance K1 and the distance K2 are in the vicinity of 500 µm, and the rate of decrease in the amount of electrons flowing in becomes saturated. Because of this, it is good that the distance K1 and the distance K2 are 150 µm or more and 500 µm or less. However, it is not preferable that the distance K1 and the distance K2 increase because the increase in distance leads to an increase in chip size. Consequently, it is good that the distance K1 and the distance K2 are preferably 150 µm or more and 250 µm or less, more preferably around 200 µm.

Figure 5:
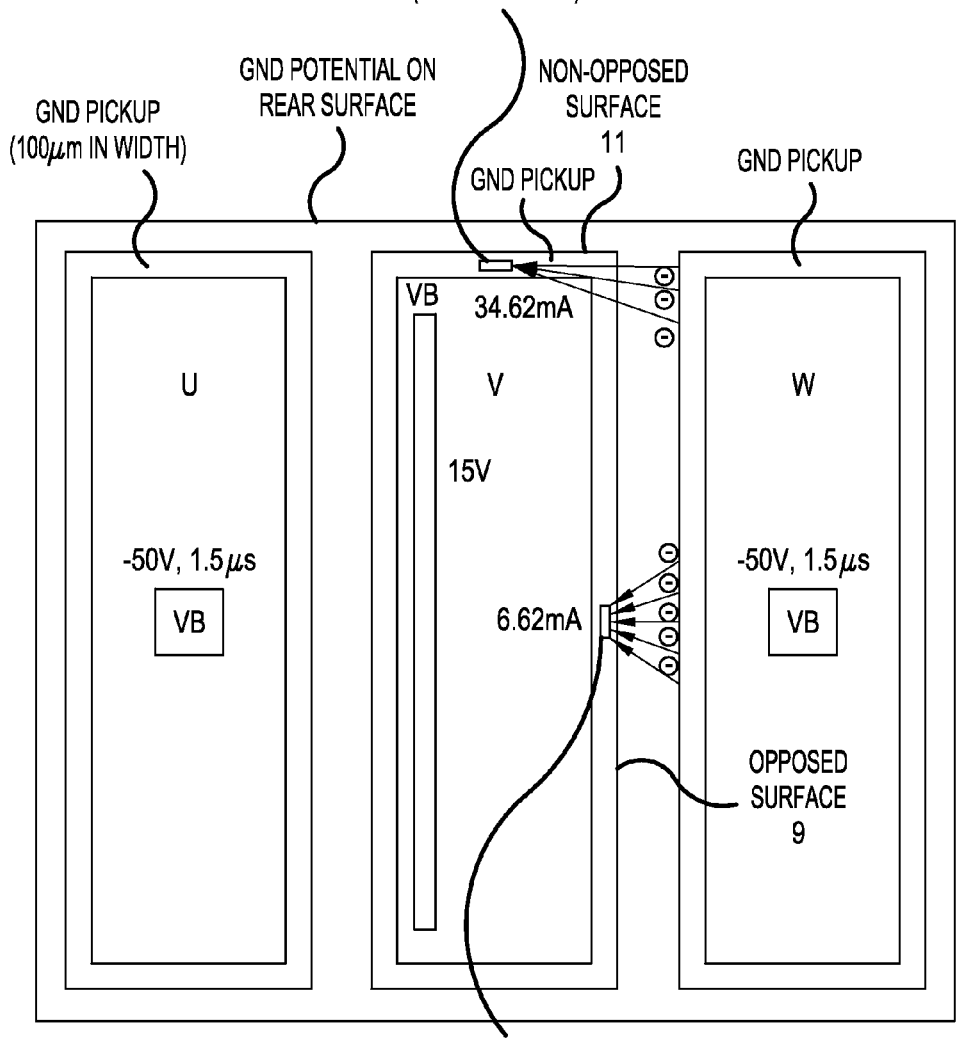
FIG. 5 is a diagram wherein the amount of electrons 50 flowing into the drain when an HVNMOS 28 is disposed on the opposed surface 9 and the amount of electrons 50 flowing into the drain when the HVNMOS 28 is disposed on a non-opposed surface 11 are compared when a negative voltage surge is applied.

FIG. 5 is a diagram wherein the amount of electrons 50 flowing into the drain when the HVNMOS 28 is disposed on the opposed surface 9 and the amount of electrons 50 flowing into the drain when the HVNMOS 28 is disposed on the non-opposed surface 11 are compared when a negative voltage surge is applied. FIG. 5 is a simulation diagram wherein the amounts of electrons 50 flowing into the drains are compared when a 1.5 µS-pulsed negative voltage surge of −50V is applied to the VB terminals of the U-phase and W-phase and a voltage of 15V is applied to the VB terminal of the V-phase.

When the HVNMOS 28 is disposed on the non-opposed surface 11, the amount of electrons 50 flowing into the n-drain region 26 is 6.62 mA when expressed in current. Meanwhile, when the HVNMOS 28 is disposed on the opposed surface 9, the amount of electrons 50 flowing into the n-drain region 26 is 34.62 mA when expressed in current. Consequently, it is confirmed that by disposing the HVNMOS 28 on the non-opposed surface 11, the amount of electrons 50 flowing into the n-drain region 26 is reduced to on the order of ⅕ compared with when the HVNMOS 28 is disposed on the opposed surface 9. As the length of the path through which electrons 50 flow is long when the HVNMOS 28 is formed on the non-opposed surface 11, the series resistance increases. Consequently, the amount of electrons 50 flowing into the n-drain region 26 is reduced.

As heretofore described, the set and reset HVNMOSs 28 may be disposed on the non-opposed surfaces, and furthermore, the n-drain regions 26 of the set and reset HVNMOSs 28 may be disposed so that the distances K1 and K2 from the opposed surface 9 are equal, or the distances K10 and K11 from the opposed surface 10 are equal. By so doing, the amounts of electrons flowing into the n-drain regions 26 decrease drastically, and are equal to each other.

Consequently, when a negative voltage surge is input into one phase, the high side driver circuit of another phase is prevented from malfunctioning. It is not only in the U-phase that the high side driver circuit is prevented from malfunctioning, but the same also applies to the V-phase and W-phase.

In the above description, the kind of self-isolation structure semiconductor device 100 shown in FIG. 2 has been illustrated. In this kind of semiconductor device 100, the n-well region 22, the n-well region 22a, the n-well region 8, the n-well region 29, and the p-well region 60 are formed by impurity ion implantation and activation treatment from the front surface of the p-type semiconductor substrate 21. By adopting the kinds of junction isolation structures shown in FIGS. 11 and 12 in place of this, it is also possible to produce the effects of the present application.

Figure 11A:
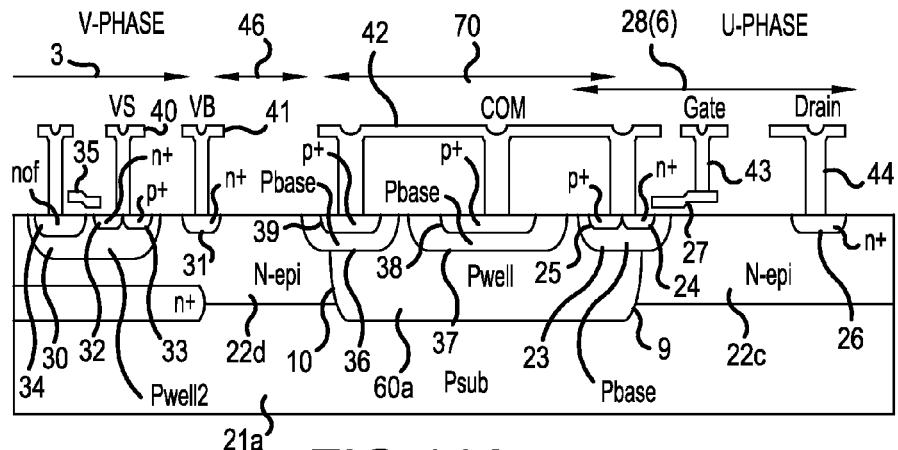
FIGS. 11A-11C are sectional views showing another example of the semiconductor device according to the working example 1.
Figure 11B:
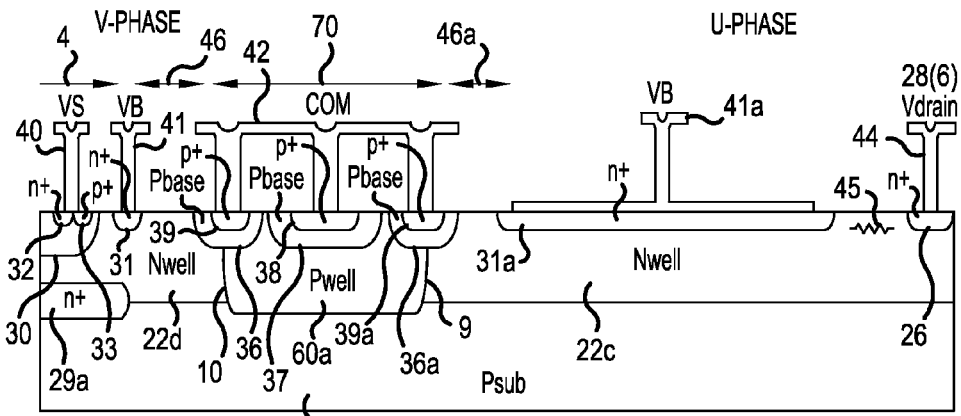
Figure 11C:
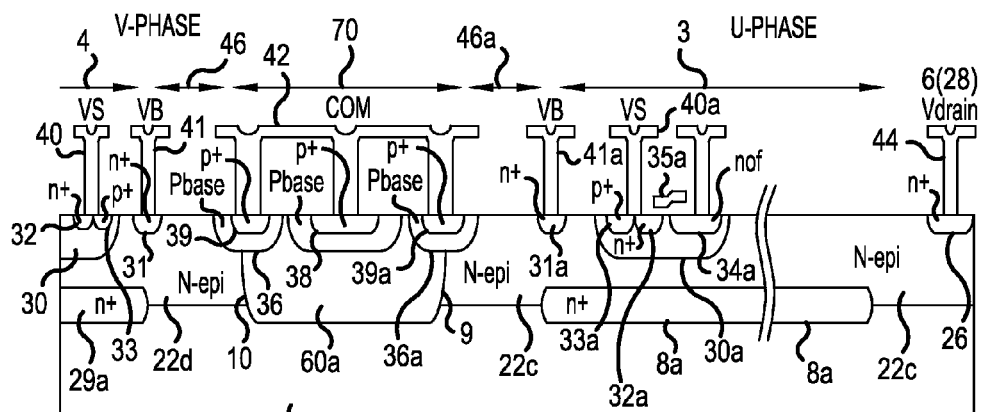

FIGS. 11A-11C are sectional views showing another example of the semiconductor device according to the working example 1. FIGS. 11A-11C show sectional view of each portion of FIGS. 1A and 1B when the semiconductor device 100 of FIGS. 1A and 1B is of a junction isolation structure. FIG. 11A is a main portion sectional view taken along the line A-A' (dashed line) of FIG. 1A, FIG. 11B is a main portion sectional view taken along the line B-B' (solid line) of FIG. 1A, and FIG. 11C is a main portion sectional view taken along the line C-C' (dashed-dotted line) of FIG. 1A.

In this case, after impurity ion implantation for forming embedded regions (8a, 29a, and the like) in the front surface of a p-type semiconductor substrate 21a is carried out, an n-type epitaxial growth layer is formed on the p-type semiconductor substrate 21a. The embedded regions (8a, 29a, and the like) are formed by activation treatment. A p-well region 60a is formed by impurity ion implantation and activation treatment from the front surface of the epitaxial growth layer so as to reach the p-type semiconductor substrate 21a. By so doing, a plurality of n-well regions (22c, 22d, and the like) are formed on the epitaxial growth layer. The other regions can be formed in the same way as in FIGS. 1A and 1B. Also, the embedded regions (8a, 29a, and the like) are n-type regions with impurity concentration higher than that of the epitaxial growth layer 22b.

Figure 12A:
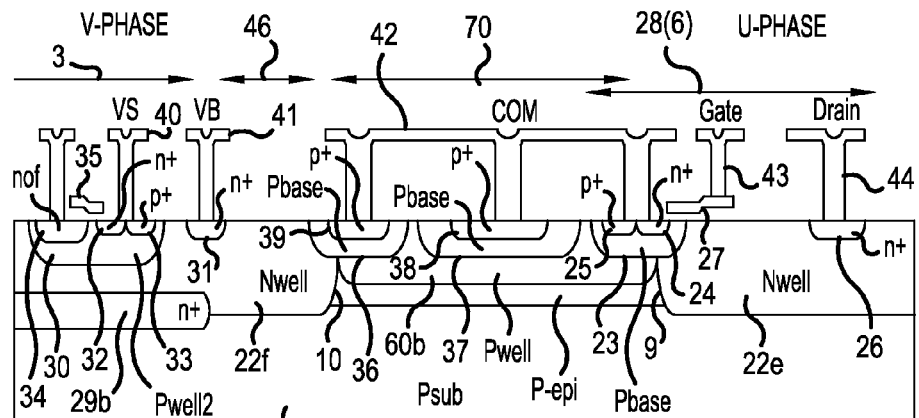
FIGS. 12A-12C are sectionals view showing another example of the semiconductor device according to the working example 1.
Figure 12B:
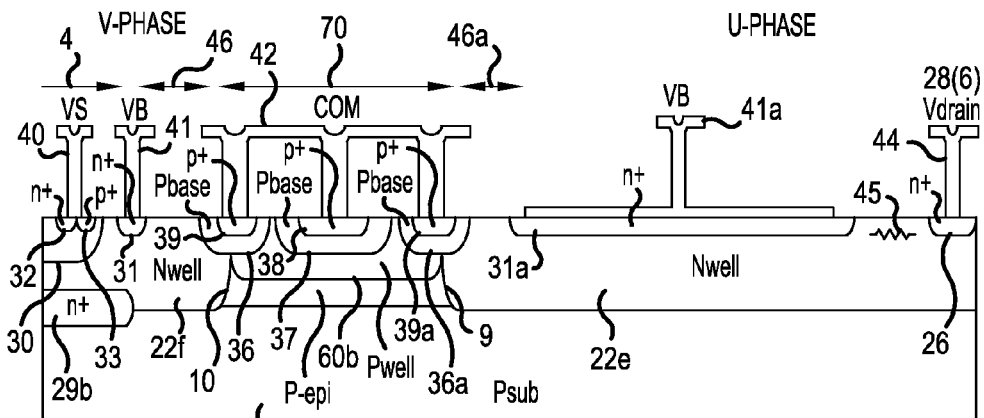
Figure 12C:
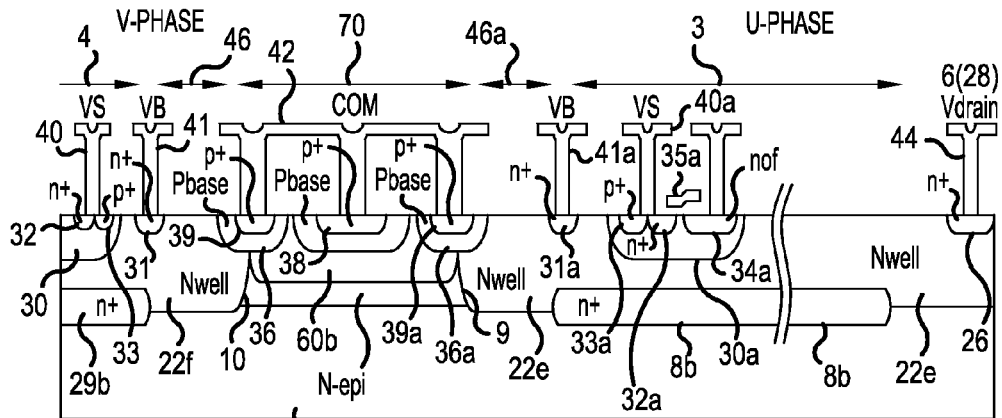

FIGS. 12A-12C are sectional views showing another example of the semiconductor device according to the working example 1. FIGS. 12A-12C show sectional views of each portion of FIGS. 1A and 1B when the semiconductor device 100 of FIGS. 1A and 1B is of a junction isolation structure different from in FIG. 11A-11C. FIG. 12A is a main portion sectional view taken along the line A-A' (dashed line) of FIG. 1A, FIG. 12B is a main portion sectional view taken along the line B-B' (solid line) of FIG. 1a, and FIG. 12c is a main portion sectional view taken along the line C-C' (dashed-dotted line) of FIG. 1a.

In this case, after impurity ion implantation for forming embedded regions (8b, 29b, and the like) in the front surface of a p-type semiconductor substrate 21b is carried out, a p-type epitaxial growth layer is formed on the p-type semiconductor substrate 21b. The embedded regions (8b, 29b, and the like) are formed by activation treatment. n-well regions (22e, 22f, and the like) are formed by impurity ion implantation and activation treatment from the front surface of the epitaxial growth layer so as to reach the p-type semiconductor substrate 21b. Also, a p-well region 60b is formed by impurity ion implantation and activation treatment from the front surface of the epitaxial layer. The other regions can be formed in the same way as in FIGS. 1A and 1B. Also, the embedded regions (8b, 29b, and the like) are n-type regions with impurity concentration higher than that of the epitaxial growth layer 22b.

WORKING EXAMPLE 2

Figure 6:
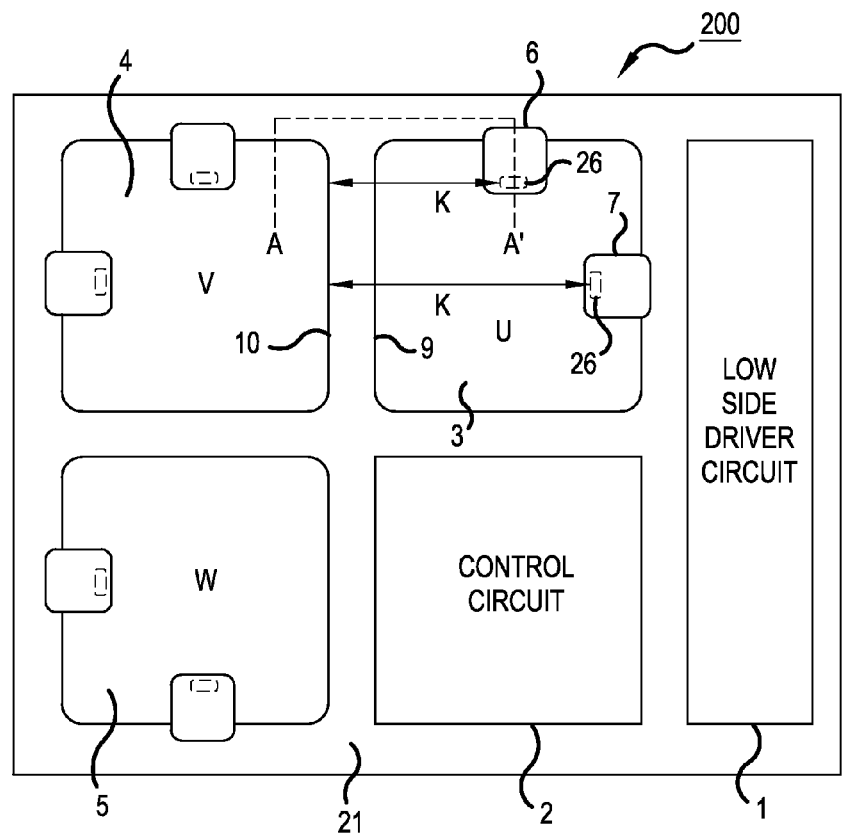
FIG. 6 is a main portion plan view of a semiconductor device according to a working example 2 of the invention.

FIG. 6 is a main portion sectional view of a semiconductor device according to a working example 2 of the invention. In the working example 2, the difference from the working example 1 (FIGS. 1A and 1B) is that distances K to the opposed surface 10 from the n-drain regions 26 of the set level shift circuit 6 and reset level shift circuit 7 are different from one another. In the second working example too, as the set level shift circuit 6 and the reset level shift circuit 7 are spaced from the opposed surface 9, the amount of electrons flowing into each n-drain region 26 is smaller than when the level shift circuits are formed on the opposed surface 9.

When a negative voltage surge is input, the ability to prevent a malfunction of the high side driver circuit 3 from occurring is lower than in the working example 1, but it is possible to suppress the occurrence of malfunction by setting the distance K between the opposed surface 9 and the n-drain region 26 of the HVNMOS 28 to be 150 μm or more and 500 μm or less. Also, it is better to set the previously mentioned distance K to be 150 μm or more and 250 μm or less. Furthermore, it is suitable to set the same distance K to be around 200 μm. A description has been given here of the U-phase, but the same also applies to the V-phase and W-phase.

WORKING EXAMPLE 3

Figure 7:
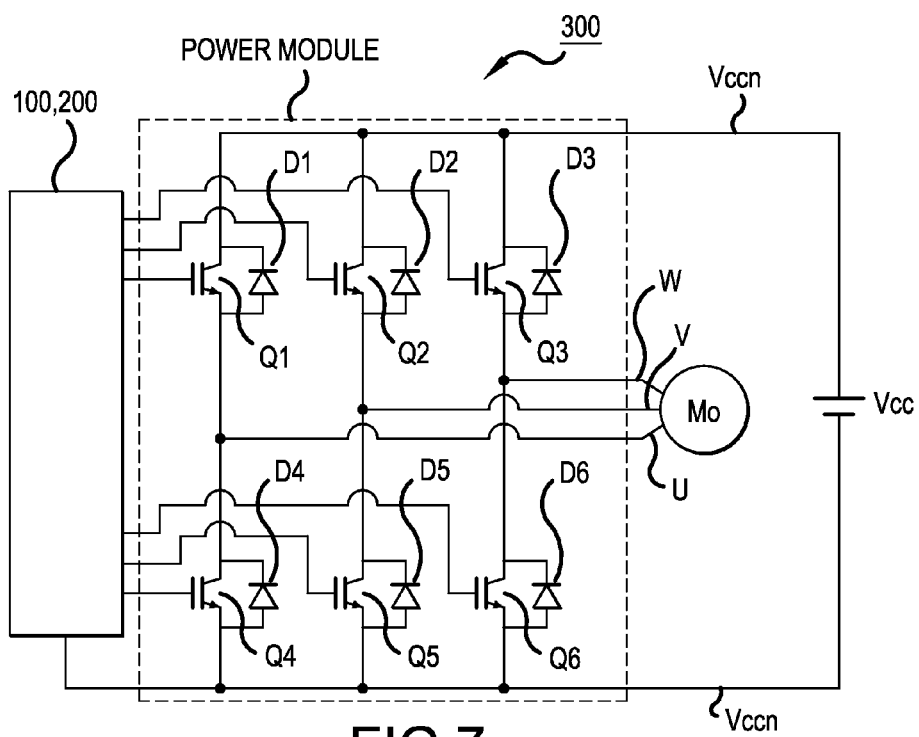
FIG. 7 is a main portion circuit diagram of a power converter device 300 according to a working example 3 of the invention.
Figure 8:
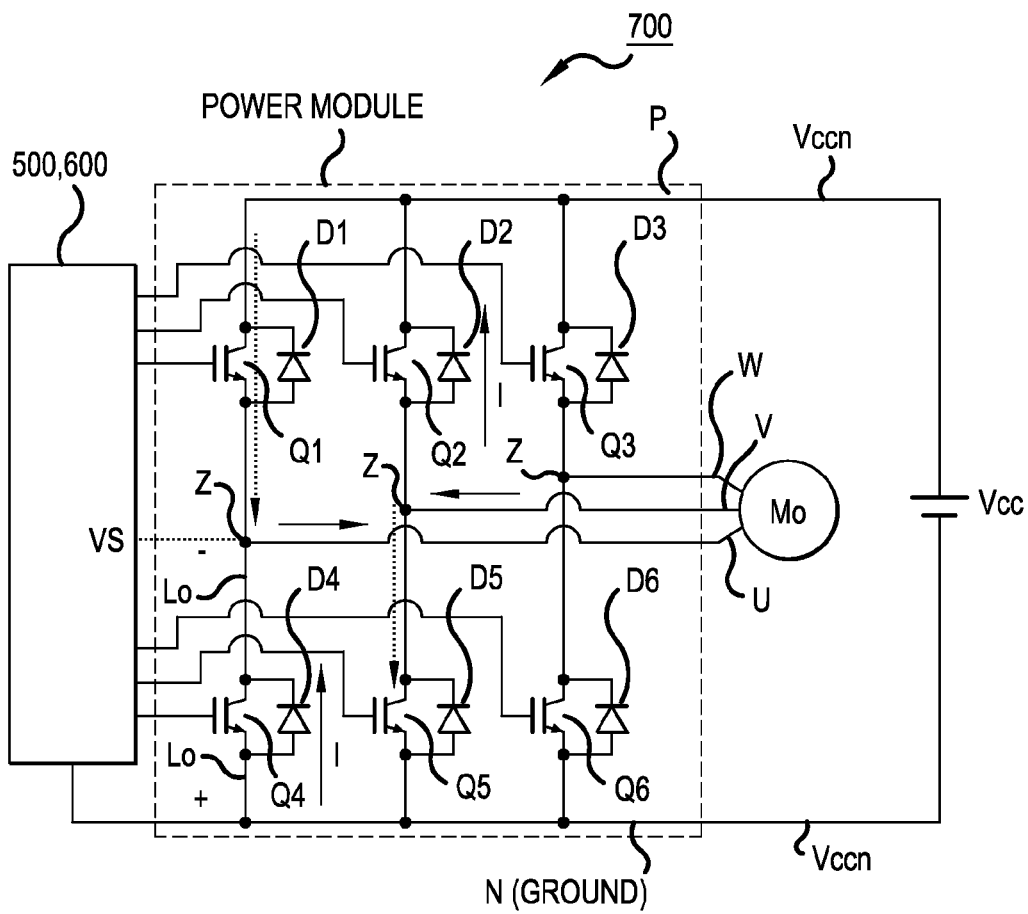
FIG. 8 is a circuit diagram of a three-phase motor Mo and a three-phase inverter which drives the three-phase motor Mo.
Figure 9A:
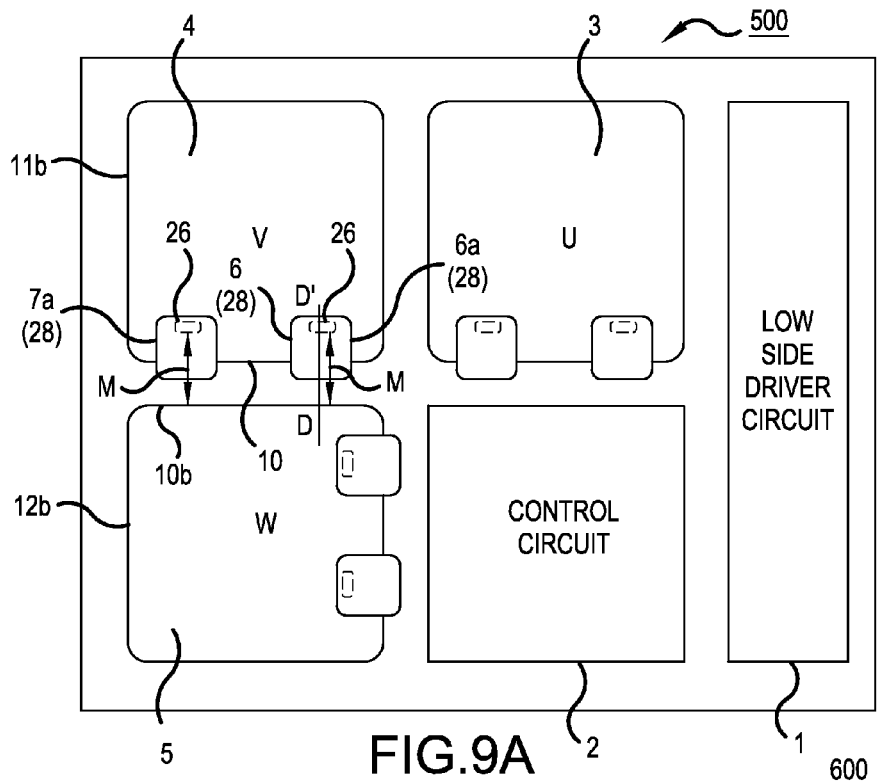
Figure 9B:
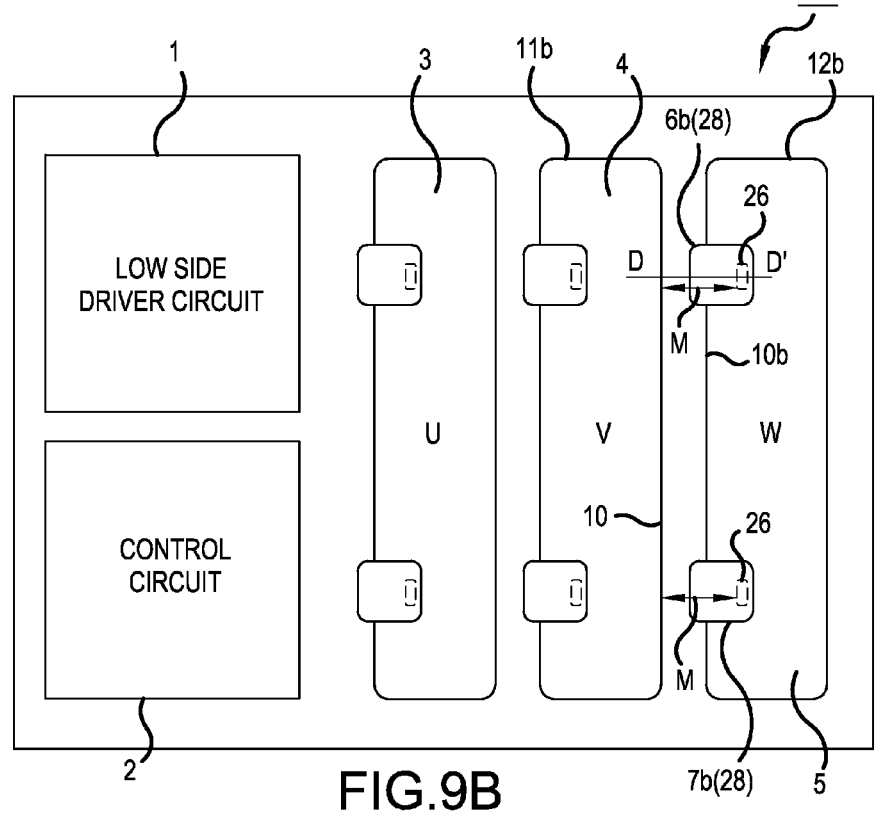
Figure 10A:
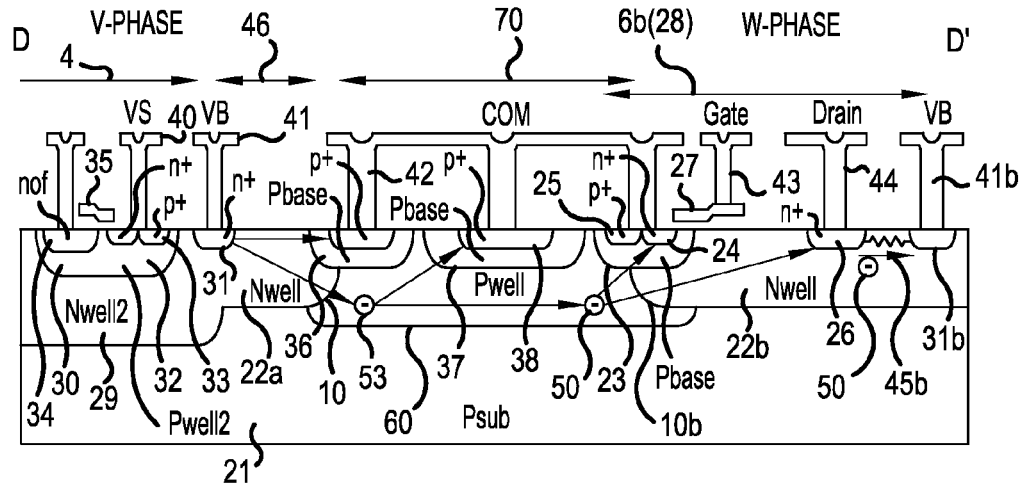
Figure 10B:
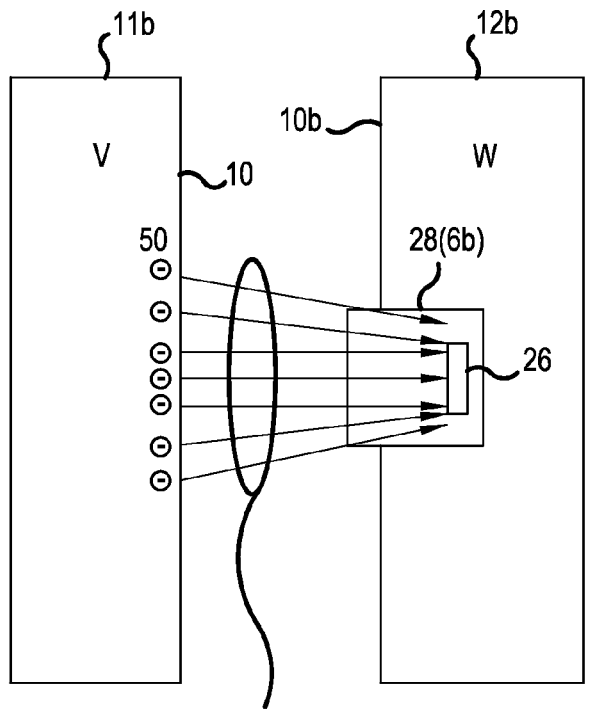

FIG. 7 is a main portion circuit diagram of a power conversion device 300 according to a working example 3 of the invention. Herein, a three-phase inverter is taken for example. The semiconductor devices 100 and 200 to be mounted on the three-phase inverter are the three-phase one-chip gate drivers IC shown in FIGS. 1A and 1B and 5. The difference between the power conversion device 300 and a heretofore known power conversion device 700 is that semiconductor devices 500 and 600 to be mounted on the power conversion device 700 shown in FIG. 8 are replaced by the semiconductor devices 100 and 200.

Herein, a three-phase inverter (three-phase bridge) has been taken as an example of the power conversion device 300, but the invention is not limited to this. It is also possible to adopt, for example, a power conversion device on which a two-or-more-phase one-chip gate driver IC is mounted, such as a single-phase (or two-phase) inverter (full bridge) or a single-phase or three-phase converter.

The semiconductor device 100 of the embodiment according to the invention includes a plurality of second conductivity type first well regions, each surrounded by a first conductivity type region, which are provided spaced from one another on the front surface layer of a semiconductor substrate; and a first conductivity type second well region, provided in contact with all the plurality of first well regions, which configures the first conductivity type region and to which a low potential is applied, wherein the plurality of first well regions each include a high side driver circuit, provided on the front surface layer of the first well region, a potential on the low potential side of which is higher than the low potential; a second conductivity type pickup region, provided on the front surface layer of the first well region, to which is connected the high potential side of a power source of the high side driver circuit; a high voltage junction termination structure provided in the first well region between the second well region and the pickup region; and two level shift elements, each provided in one portion of the high voltage junction termination structure and second well region, which send signals for driving the high side driver circuit, the semiconductor device being characterized in that the two level shift elements (for example, the HVNMOSs 28 of the level shift circuits 6 and 7 of the U-phase) are disposed on respective non-opposed surfaces 11 which are not opposite to the adjacent first well region, and distances K1 and K2 to high potential regions (the n-drain regions 26) of the two level shift elements from a pn junction surface (the opposed surface 9), of a pn junction surface of the first well region (for example, the n-well region 22 of the U-phase) and second well region (the p-well region 60), which is opposite to the adjacent first well region (for example, the n-well region 22a of the V-phase) are equal to or more than 150 μm.

According to the semiconductor device 100 of the embodiment according to the invention, it is possible to drastically reduce the amounts of electrons flowing into the high potential regions of the level shift elements of another phase due to a negative voltage surge. Consequently, it is possible to suppress a malfunction of the high side driver circuit.

Also, the semiconductor device 100 of the embodiment according to the invention includes a plurality of second conductivity type first well regions, each surrounded by a first conductivity type region, which are provided spaced from one another on the front surface layer of a semiconductor substrate; and a first conductivity type second well region, provided in contact with all the plurality of first well regions, which configures the first conductivity type region and to which a low potential is applied, wherein the plurality of first well regions each include a high side driver circuit, provided on the front surface layer of the first well region, a potential on the low potential side of which is higher than the low potential; a second conductivity type pickup region, provided on the front surface layer of the first well region, to which is connected the high potential side of a power source of the high side driver circuit; a high voltage junction termination structure provided in the first well region between the second well region and the pickup region; and two level shift elements, each provided in one portion of the high voltage junction termination structure and second well region, which send signals for driving the high side driver circuit, the semiconductor device being characterized in that the two level shift elements are disposed on respective non-opposed surfaces 11 which are not opposite to the adjacent first well region, and the difference between distances K10 and K11 to high potential regions of the two level shift elements from the adjacent first well region (the opposed surface 10) is equal to or less than 10 μm.

According to the semiconductor device 100 of the embodiment according to the invention, the amounts of electrons 50 flowing into the high potential regions of the level shift elements of another phase due to a negative voltage surge can be made substantially equal.

Also, the semiconductor device 100 of the embodiment according to the invention is characterized in that the distance from the pn junction surface, of the pn junction surface of the first well region and second well region, which is opposite to the adjacent first well region is shorter to the pickup region than to each of the high potential regions of the two level shift elements.

Also, the semiconductor device 100 of the embodiment according to the invention is characterized in that the distances from the adjacent first well region to the high potential regions of the two level shift elements are substantially equal.

Also, the semiconductor device 100 of the embodiment according to the invention is characterized in that the distances K1 and K2 to the high potential regions of the two level shift elements from the pn junction surface, of the pn junction surface of the first well region and second well region, which is opposite to the adjacent first well region are equal to or more than 150 μm.

Also, the semiconductor device 100 of the embodiment according to the invention is characterized in that the distances K1 and K2 to the high potential regions of the two level shift elements from the pn junction surface, of the pn junction surface of the first well region and second well region, which is opposite to the adjacent first well region are equal to or less than 500 μm.

Also, a power conversion device 300 of the embodiment according to the invention is characterized in that the semiconductor device 100 is mounted on the power conversion device 300.

According to the semiconductor device 100 of the embodiment according to the invention and the power conversion device 300 on which the semiconductor device 100 is mounted, the amounts of electrons flowing into the high potential regions of the level shift elements of another phase due to a negative voltage surge can be drastically reduced, and the amounts of electrons 50 flowing into the high potential regions of the level shift elements of another phase due to a negative voltage surge can be made substantially equal. Consequently, it is possible to suppress a malfunction of the high side driver circuit.

As above, a method of manufacturing the semiconductor device according to the invention is useful for a semiconductor device such as a high voltage IC having level shift circuits and a power conversion device such as an inverter using the semiconductor device.

What is claimed is:

1. A semiconductor device comprising:
a plurality of second conductivity type first well regions, each surrounded by a first conductivity type region, which are provided spaced from one another on a front surface layer of a semiconductor substrate; and a first conductivity type second well region, provided in contact with all the plurality of first well regions, which configures the first conductivity type region and to which a low potential is applied, wherein
the plurality of first well regions each include: a high side driver circuit, provided on a front surface layer of each respective first well region, a potential on a low potential side of which is higher than the low potential; a second conductivity type pickup region, provided on the front surface layer of each respective first well region, to which is connected a high potential side of a power source of the high side driver circuit; a high voltage junction termination structure provided in each respective first well region, between the second well region and the pickup region; and two level shift elements, each provided in one portion of the high voltage junction termination structure and the second well region, which send signals for driving the high side driver circuit, and
for at least one of the respective first well regions, the two level shift elements of the at least one first well region are disposed on respective non-opposed surfaces which are not opposite to another of the first well regions that is adjacent to the at least one first well region, and distances to high potential regions of the two level shift elements from a pn junction surface, of a pn junction surface of the at least one first well region and the second well region, which is opposite to the another of the first well regions, are greater than or equal to 150 µm and less than or equal to 500 µm.

2. The semiconductor device according to claim 1, wherein
the distance from the pn junction surface, of the pn junction surface of the at least one first well region and second well region, which is opposite to the another first well region is shorter to the pickup region than to each of the high potential regions of the two level shift elements.

3. A power conversion device, wherein
the semiconductor device according to claim 1 is mounted on the power conversion device.

4. A semiconductor device comprising:
a plurality of second conductivity type first well regions, each surrounded by a first conductivity type region, which are provided spaced from one another on a front surface layer of a semiconductor substrate; and a first conductivity type second well region, provided in contact with all the plurality of first well regions, which configures the first conductivity type region and to which a low potential is applied, wherein
the plurality of first well regions each include: a high side driver circuit, provided on a front surface layer of each respective first well region, a potential on a low potential side of which is higher than the low potential; a second conductivity type pickup region, provided on the front surface layer of each respective first well region, to which is connected a high potential side of a power source of the high side driver circuit; a high voltage junction termination structure provided in each respective first well region between the second well region and the pickup region; and two level shift elements, each provided in one portion of the high voltage junction termination structure and the second well region, which send signals for driving the high side driver circuit, and
for at least one of the respective first well regions, the two level shift elements of the at least one first well region are disposed on respective non-opposed surfaces which are not opposite to another of the first well regions that is adjacent to the at least one first well region, and a difference between distances to high potential regions of the two level shift elements from the another of the first well regions, is greater than or equal to 0 µm and less than or equal to 10 µm.

5. The semiconductor device according to claim 4, wherein
a distance from a pn junction surface, of a pn junction surface of the at least one first well region and second well region, which is opposite to the another first well region is shorter to the pickup region than to each of the high potential regions of the two level shift elements.

6. The semiconductor device according to claim 4, wherein
the distances from the another first well region to the high potential regions of the two level shift elements are substantially equal.

7. The semiconductor device according to claim 4, wherein
the distances to the high potential regions of the two level shift elements from a pn junction surface, of a pn junction surface of the at least one first well region and second well region, which is opposite to the adjacent first well region are greater than or equal to 150 µm and less than or equal to 500 µm.

8. The semiconductor device according to claim 5, wherein
the distances to the high potential regions of the two level shift elements from the pn junction surface, of the pn junction surface of the at least one first well region and second well region, which is opposite to the adjacent first well region are greater than or equal to 150 µm and less than or equal to 500 µm.

9. A power conversion device, wherein
the semiconductor device according to claim 4 is mounted on the power conversion device.

* * * * *